(12) United States Patent
Archibald et al.

(10) Patent No.: US 8,270,161 B2
(45) Date of Patent: Sep. 18, 2012

(54) HOT OR COLD AISLE COMPUTER CHASSIS

(75) Inventors: Matthew R. Archibald, Morrisville, NC (US); Jerrod K. Buterbaugh, Wake Forest, NC (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 12/851,992

(22) Filed: Aug. 6, 2010

(65) Prior Publication Data

US 2012/0033368 A1 Feb. 9, 2012

(51) Int. Cl.
*H05K 7/20* (2006.01)
(52) U.S. Cl. ......... 361/690; 361/691; 361/692; 454/184
(58) Field of Classification Search .................. None
See application file for complete search history.

(56) References Cited

U.S. PATENT DOCUMENTS

| | | | | |
|---|---|---|---|---|
| 6,526,702 | B2 * | 3/2003 | Jones | 52/64 |
| 7,074,123 | B2 * | 7/2006 | Bettridge et al. | 454/184 |
| 7,259,963 | B2 * | 8/2007 | Germagian et al. | 361/695 |
| 7,486,511 | B1 | 2/2009 | Griffel et al. | |
| 7,656,660 | B2 * | 2/2010 | Hoeft et al. | 361/679.51 |
| 7,862,410 | B2 * | 1/2011 | McMahan et al. | 454/184 |
| 7,986,526 | B1 * | 7/2011 | Howard et al. | 361/694 |
| 2006/0260338 | A1 | 11/2006 | VanGilder et al. | |
| 2007/0173189 | A1 * | 7/2007 | Lewis | 454/184 |
| 2009/0107652 | A1 | 4/2009 | VanGilder et al. | |
| 2009/0173017 | A1 | 7/2009 | Hall | |
| 2009/0277605 | A1 | 11/2009 | VanGilder et al. | |
| 2011/0189936 | A1 * | 8/2011 | Haspers et al. | 454/184 |

* cited by examiner

*Primary Examiner* — Boris Chervinsky
(74) *Attorney, Agent, or Firm* — Brandon C. Kennedy; Cynthia G. Seal; Biggers & Ohanian, LLP

(57) ABSTRACT

A chassis for a plurality of computers for use in a data center, the chassis at least one extensible fin, the fin either extensible perpendicularly from the front of the chassis or extensible parallel with the front of the chassis.

4 Claims, 5 Drawing Sheets

```
┌─────────────────────────────────────┐
│  Arranging A Plurality Of Blade     │
│  Environments In Two Rows Such That │
│  The Front Of Each Of The Blade     │
│  Environments Of The First Row      │
│  Faces The Front Of Each Of The     │
│  Blade Environments Of The Second   │
│  Row 402                            │
└─────────────────────────────────────┘
                  │
                  ▼
┌─────────────────────────────────────┐
│  Extending The Fins Of Each Of The  │
│  Chassis Of The Blade Environments  │
│  To Create An Aisle Between The     │
│  Rows Of Blade Environments 404     │
└─────────────────────────────────────┘
```

FIG. 4

```
┌─────────────────────────────────────┐
│  Arranging At Least Two Blade       │
│  Environments Such That The Front   │
│  Of A First Blade Environments      │
│  Faces The Front Of A Second        │
│  Blade Environment 502              │
└─────────────────────────────────────┘
                  │
                  ▼
┌─────────────────────────────────────┐
│  Extending The Fins Of Each Of The  │
│  Chassis Of The Blade Environments  │
│  To Create An Aisle Between The At  │
│  Least Two Blade Environments 504   │
└─────────────────────────────────────┘
```

FIG. 5

HOT OR COLD AISLE COMPUTER CHASSIS

BACKGROUND OF THE INVENTION

1. Field of the Invention

The field of the invention is chassis for computers in data centers and data center organization.

2. Description of Related Art

Typical data centers have floor tiles that are perforated. Air conditioning systems below the floor blow cooled air through the perforated floor tiles to cool the computers of the data centers. Conventional chassis include fans in the chassis that blow the cooled air over the computers in the chassis

SUMMARY OF THE INVENTION

A chassis for a plurality of computers for use in a data center, the chassis including at least one extensible fin, the fin either being extensible perpendicularly from the front of the chassis or being extensible parallel with the front of the chassis.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 4 sets forth a flow chart illustrating an exemplary method for organizing a data center.

FIG. 5 sets forth a flow chart illustrating an exemplary method for organizing a data center.

DETAILED DESCRIPTION OF EXEMPLARY EMBODIMENTS

Figure 1:
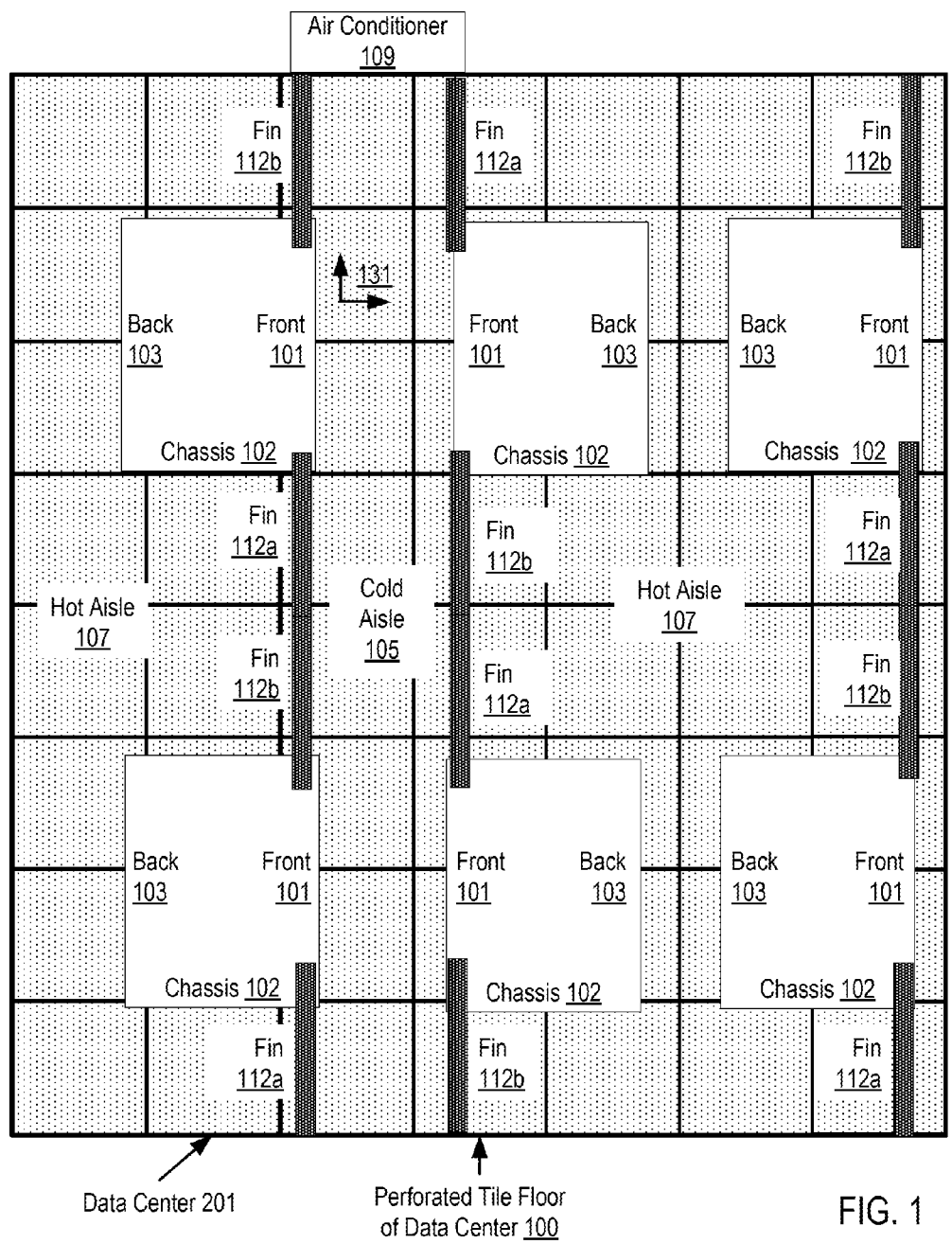
FIG. 1 sets forth a block diagram of an aerial view of a data center organized according to embodiments of the present invention and including a plurality of chassis each including a plurality of computers for use in the data center.

Exemplary chassis for use in data centers and methods for organizing data centers in accordance with the present invention are described with reference to the accompanying drawings, beginning with FIG. 1. FIG. 1 sets forth a block diagram of an aerial view of a data center (201) organized according to embodiments of the present invention and including a plurality of chassis (102) each including a plurality of computers for use in the data center. A data center is a facility used to house computer systems and associated components, such as telecommunications and storage systems. Data centers typically also include redundant or backup power supplies, redundant data communications connections, and environmental controls such as air conditioning, fire suppression, and security devices.

The data center (201) of FIG. 1 has a perforated tile floor (100) and an air conditioning system (109) to blow cooled air beneath the perforated tile floor. Cooled air is blown from beneath the perforated tile floor of data center to cool the computers contained in the chassis (102) of the data center.

The data center (201) of FIG. 1 includes a number of chassis (102) each containing a plurality of computers for use in a data center (201). Each chassis (201) of the data center (201) includes at least one extensible fin (112a and 112b). In the example of FIG. 1 each chassis has two fins (112a and 112b) extensible from each side of the chassis and the fins are extensible perpendicularly (131) from the front (101) of the chassis (102). The extensible fins are typically the height of the chassis or tall enough to usefully create aisles between the chassis of the data center. Extensible fins for chassis according to embodiments of the present invention may be integrated in the chassis when the chassis is build or added on after the chassis is built or integrated with the chassis in any other way that will occur to those of skill in the art. Extensible fins for chassis according to embodiments of the present invention may be implemented as collapsible accordion panels, rigid panels with a slidable engagements with the chassis, rigid panels with hinged engagements, or any other type of fins and engagement that will occur to those of skill in the art.

Each chassis (102) of the data center (201) of FIG. 1 has a front (101) and a back (103). The chassis of FIG. 1 are arranged in rows with the front (101) of each chassis in each row facing the front (101) of each chassis (102) in a next row and the back (103) of each chassis in a row facing the back (103) of each chassis in a next row. Each fin (112a and 112b) of each chassis of FIG. 1 has at least one connector to connect the fin to either another chassis or to connect the fin to the fin of another chassis. In this way, aisles are formed between the rows of chassis.

The chassis (102) of the data center also contain fans to blow air from the front of the chassis across the computers of the chassis to the back of the chassis. The extensible fins of the chassis of the data center of FIG. 1 therefore create a cold aisle (105) between the rows of chassis whose fronts (101) face one anther and a hot aisle (107) between the rows of chassis whose backs (103) face one another. In alternative embodiments, fans may blow air in the other direction over the computers of the chassis thereby reversing the hot and cold aisles.

After blowing across the chassis hot air may be captured from the hot aisle then cooled. The recaptured air may then be returned to a cold aisle increasing efficiency and regulating air flow.

The arrangement of servers and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
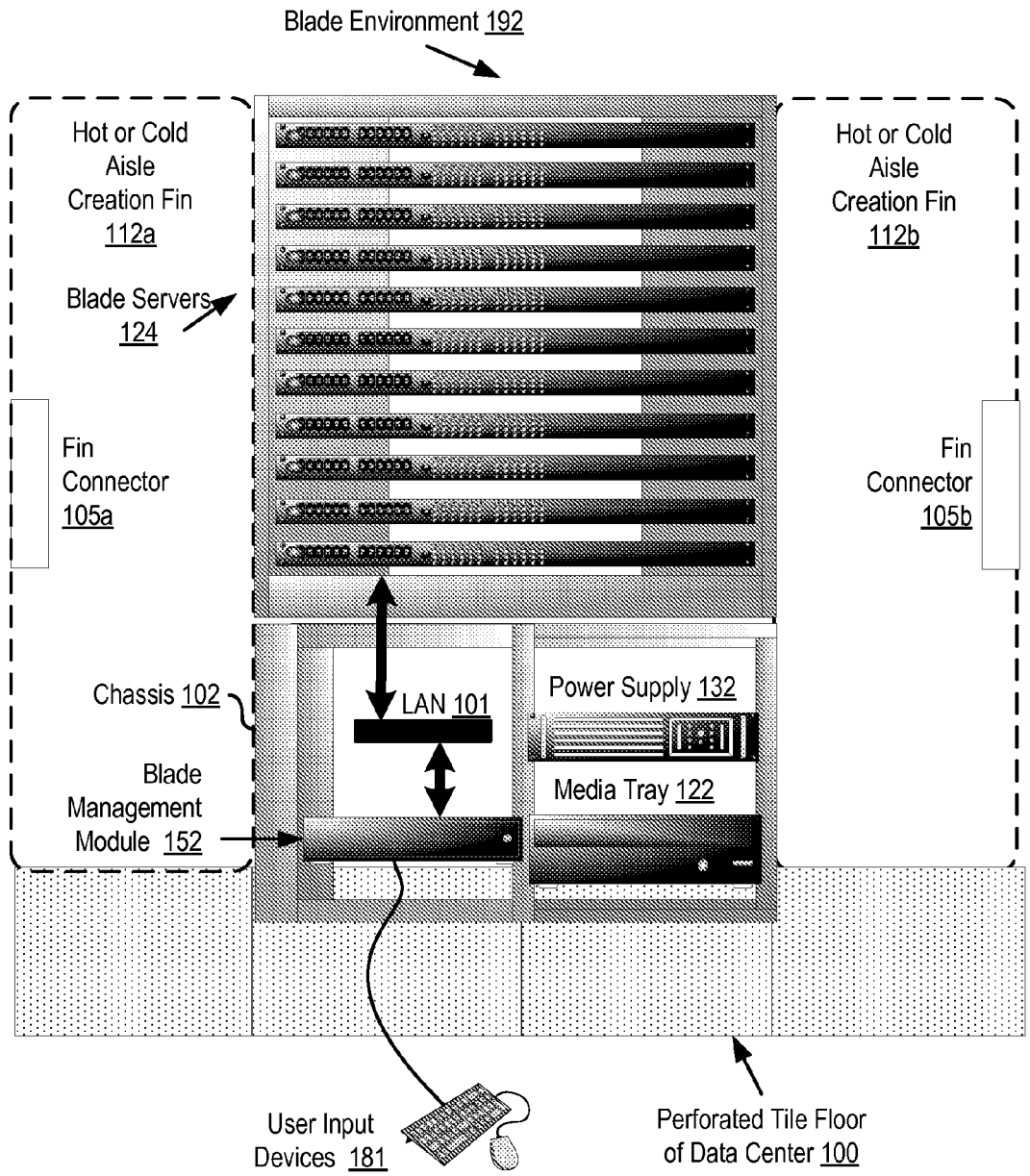
FIG. 2 sets forth a diagram of a blade environment having a chassis according to embodiments of the present invention.

For further explanation, FIG. 2 sets forth a diagram of a blade environment having a chassis according to embodiments of the present invention. The example of FIG. 2 includes a blade environment (192). 'Blade environment,' as the term is used in this specification, refers generally to a blade server system installed in this example in a two-bay chassis (102) and including a number of blade servers (124), one or more blade management modules (152), a media tray (122), and a blade server system power supply (132).

The blade management module (152) is a small computer in its own right, including software and hardware components, one or more computer processors and computer memory, that provides system management functions for all components in the example blade environment (192) including the blade servers (124) and the media tray (122). The blade management module of FIG. 2 also makes available connections for user input devices such as mice or keyboards (181) that are not generally connected directly to the blade servers or to the blade environment chassis. The blade servers themselves (124), installed in a cabinet bay (126) of the exemplary blade environment (192) in the example of FIG. 2, are several computing devices implemented in blade form factor. The blade servers share access to the media tray (122). The blade servers (124) are connected to one another and to the blade management module (152) for data communications through a local area network ('LAN') (101). The LAN (101) is a small network installed within the chassis of the blade environment.

The media tray (122) houses non-volatile memory media generally. A media tray may typically include Compact Disc read-only media drives ('CD-ROM'), Digital Video Disc ROM drives (DVD-ROM), CD-RW drives, DVD-RW drives, floppy disk drives, and so on as will occur those of skill in the art.

The chassis (102) of the blade environment of FIG. 2 includes two hot or cold aisle creation fins (112a and 112b) which are extensible perpendicularly from the front of the chassis. The hot or cold aisle creation fins (112a and 112b) in FIG. 2 are implemented as rigid panels that are slidably engaged with the chassis. That is, the fins (112a and 112b) slide out perpendicularly with respect to the front of the chassis. Each fin (112a and 112b) has a fin connector (105a and 105b) which may be used to connect the fin to either the fin of another chassis or to another chassis itself. Such connectors may be implemented as latches, fasteners, hook fasters and others as will occur to those of skill in the art. With the fins extended between a number of chassis according to the example of FIG. 1 a hot or cold aisle may be created on the perforated tile floor (100) of a data center.

The arrangement of the blade environment (192), network (101), and other devices making up the exemplary system illustrated in FIG. 2 are for explanation, not for limitation. Data processing systems useful according to various embodiments of the present invention may include additional servers, routers, and other devices, not shown in FIG. 2, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 2.

In the example of FIGS. 1 and 2, the chassis included fins that were extensible perpendicularly with respect to the front of the chassis. In alternative embodiments, chassis according to embodiments of the present invention may include fins that are extensible in a manner parallel with the front of the chassis. For further explanation, FIG. 3 sets forth a block diagram of an aerial view of a data center (201) organized according to some embodiments of the present invention and including a plurality of chassis (102) each including a plurality of computers for use in the data center. The data center (201) of FIG. 3, like the data center of FIGS. 1 and 2, has a perforated tile floor (100) beneath which is installed an air conditioning system. Cooled air is blown from beneath the perforated tile floor of data center to cool the computers contained in the chassis (102) of the data center.

Figure 3:
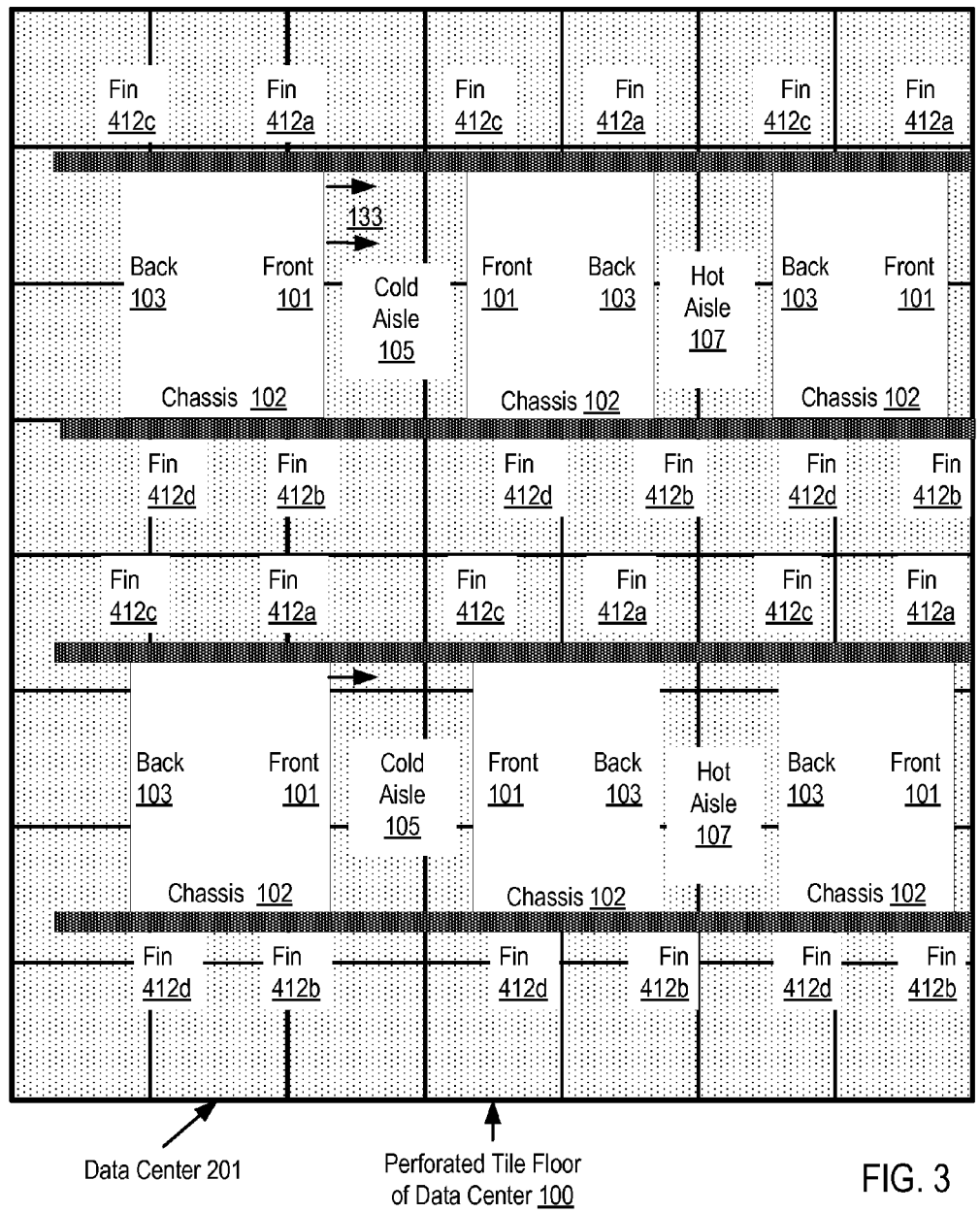
FIG. 3 sets forth a block diagram of an aerial view of a data center organized according to some embodiments of the present invention and including a plurality of chassis each including a plurality of computers for use in the data center.

The data center (201) of FIG. 3 includes a number of chassis (102) each containing a plurality of computers for use in a data center (201). Each chassis (102) of FIG. 3 includes two extensible fin (412a and 412b) that are extensible in a manner that is parallel (133) with the front (101) of the chassis (102). Each chassis (102) of FIG. 3 also includes two extensible fins (412c and 412d) that are extensible in a manner that is parallel with the back (103) of the chassis (102). Extensible fins for chassis according to embodiments of the present invention may be integrated in the chassis when the chassis is build or added on after the chassis is built or installed in the data center or integrated with the chassis in other ways as will occur to those of skill in the art. Extensible fins for chassis according to embodiments of the present invention may be implemented as collapsible accordion panels, rigid panels with a slidable engagements with the chassis, rigid panels with hinged engagements, or any other type of fins or engagement that will occur to those of skill in the art.

Each chassis (102) of the data center (201) of FIG. 3 has a front (101) and a back (103). The chassis of FIG. 3 are arranged in rows such that at least two chassis (102) of a row have fronts (101) that face one another and have backs (103) that face one another. Each fin (112a and 112b) of each chassis of FIG. 1 has connector to connect the fin (412c and 412d) of another chassis. Such connectors may be implemented as latches, fasteners, hook fasters and others as will occur to those of skill in the art. In alternative embodiments, the fins of the chassis may connect directly to another chassis rather than to the fins of another chassis.

The chassis (102) of the data center also contain fans to blow air from the front of the chassis across the computers of the chassis to the back of the chassis. In each row of the example of FIG. 3, the extensible fins therefore create a cold aisle (105) between the chassis whose fronts (101) face one anther and a hot aisle (107) between the chassis whose backs (103) face one another. In alternative embodiments, fans may blow air in the other direction over the computers of the chassis thereby reversing the hot and cold aisles.

After blowing across the chassis hot air may be captured from the hot aisle then cooled. The recaptured air may then be returned to a cold aisle increasing efficiency and regulating air flow.

In the example of FIG. 3, the fins on each of the two rows of chassis are engaged to create two sets of hot and cold aisles. In alternative embodiments, the two rows of chassis may be placed side to side such that the chassis are next to one another. In such embodiments, extending the outside fins of each chassis creates a single and larger hot aisle and a single and larger cold aisle instead of two hot and cold aisles.

The arrangement of servers and other devices making up the exemplary system illustrated in FIG. 3 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 3.

For further explanation, FIG. 4 sets forth a flow chart illustrating an exemplary method for organizing a data center. The data center of the example of FIG. 4 includes a plurality of blade environments, each blade environment including a chassis having at least one extensible fin which is extensible perpendicularly with respect to the front of the chassis. The data center also includes a perforated tile floor and an air conditioning system below the floor and air conditioning system blows cooled air through the perforated tile floor.

The method of FIG. 4 includes arranging (402) a plurality of blade environments in two rows such that the front of each of the blade environments of the first row faces the front of each of the blade environments of the second row. Arranging (402) a plurality of blade environments in two rows such that the front of each of the blade environments of the first row faces the front of each of the blade environments of the second row results in an organization of blade environments similar to the example of FIG. 1.

The method of FIG. 4 also includes extending (404) the fins of each of the chassis of the blade environments to create an aisle between the rows of blade environments. Extending (404) the fins of each of the chassis of the blade environments to create an aisle between the rows of blade environments may be carried out by connecting the fin of at least one of blade environment to the fin of at least one other blade environment. Extending (404) the fins of each of the chassis of the blade environments to create an aisle between the rows of blade environments may also be carried out by connecting the fin of at least one of the blade environments to the chassis of at least one other blade environment.

For further explanation, FIG. 5 sets forth a flow chart illustrating an exemplary method for organizing a data center. The data center of the example of FIG. 5 includes a plurality of blade environments, each blade environment including a chassis having at least one extensible fin which is extensible parallel with respect to the front of the chassis. The data center also includes a perforated tile floor and an air conditioning system below the floor and air conditioning system blows cooled air through the perforated tile floor.

The method of FIG. 5 includes arranging (502) at least two blade environments such that the front of a first blade environments faces the front of a second blade environment. Arranging (502) at least two blade environments such that the front of a first blade environments faces the front of a second blade environment results an organization of blade environments similar to the example of FIG. 3.

The method of FIG. 5 also includes extending (504) the fins of each of the chassis of the blade environments to create an aisle between the at least two blade environments. Extending (504) the fins of each of the chassis of the blade environments to create an aisle between the rows of blade environments may be carried out by connecting the fin of at least the first blade environment to the fin of at least the second blade environment. Extending (504) the fins of each of the chassis of the blade environments to create an aisle between the rows of blade environments may also be carried out by connecting the fin of at least the first blade environment to the chassis of at least the second blade environment.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of organizing a data center, the data center including a plurality of blade environments, each blade environment including a chassis having at least one extensible fin which is extensible perpendicularly with respect to the front of the chassis, and wherein the data center includes a perforated tile floor and an air conditioning system to blow cool air below the floor, the air conditioning system blowing cooled air through the perforated tile floor, the method comprising:

arranging a plurality of blade environments in two rows such that the front of each of the blade environments of the first row faces the front of each of the blade environments of the second row; and extending the fins of each of the chassis of the blade environments to create an aisle between the rows of blade environments.

2. The method of claim 1 wherein extending the fins of each of the chassis of the blade environments to create an aisle between the rows of blade environments further comprises connecting the fin of at least one of blade environment to the fin of at least one other blade environment.

3. The method of claim 1 wherein extending the fins of each of the chassis of the blade environments to create an aisle between the rows of blade environments further comprises connecting the fin of at least one of the blade environments to the chassis of at least one other blade environment.

4. A method of organizing a data center, the data center including a plurality of blade environments, each blade environment including a chassis having at least one extensible fin which is extensible parallel with respect to the front of the chassis, and wherein the data center includes a perforated tile floor and an air conditioning system to blow cooled air below the floor, the air conditioning system blowing cooled air through the perforated tile floor, the method comprising:

arranging at least two blade environments such that the front of a first blade environments faces the front of a second blade environment; and extending the fins of each of the chassis of the blade environments to create an aisle between the at least two blade environments.

* * * * *